(12) United States Patent
Hirose et al.

(10) Patent No.: US 7,504,330 B2
(45) Date of Patent: Mar. 17, 2009

(54) METHOD OF FORMING AN INSULATIVE FILM

(75) Inventors: Takayuki Hirose, Sagamihara (JP); Masaharu Edo, Tokorozawa (JP); Akira Sato, Matsumoto (JP)

(73) Assignee: Fuji Electric Holdings Co., Ltd., Kawasaki-shi, Kanagawa (JP)

( * ) Notice: Subject to any disclaimer, the term of this patent is extended or adjusted under 35 U.S.C. 154(b) by 31 days.

(21) Appl. No.: 11/882,791

(22) Filed: Aug. 6, 2007

(65) Prior Publication Data

US 2008/0045038 A1 Feb. 21, 2008

(30) Foreign Application Priority Data

Aug. 21, 2006 (JP) ............................. 2006-223775

(51) Int. Cl.
 *H01L 21/00* (2006.01)
(52) U.S. Cl. ................. 438/596; 438/624; 438/636; 438/682; 438/786; 257/E21.514; 257/E21.515; 257/E21.519
(58) Field of Classification Search ............... 438/596, 438/622, 624, 656, 682, 782; 257/E21.514, 257/515, 519
See application file for complete search history.

(56) References Cited

U.S. PATENT DOCUMENTS

| | | | |
|---|---|---|---|
| 4,927,733 A | | 5/1990 | Stout |
| 5,192,635 A | * | 3/1993 | Inukai et al. ............. 430/111.1 |
| 5,397,401 A | * | 3/1995 | Toma et al. ................. 136/259 |
| 5,721,007 A | * | 2/1998 | Lynch et al. ........... 204/192.14 |
| 5,972,480 A | * | 10/1999 | Yoshikawa et al. ....... 428/32.63 |
| 5,980,977 A | * | 11/1999 | Deng et al. .................... 427/79 |
| 6,600,224 B1 | * | 7/2003 | Farquhar et al. ............ 257/731 |
| 6,739,040 B1 | * | 5/2004 | Nakamura et al. ........... 29/830 |
| 6,869,750 B2 | * | 3/2005 | Zhang et al. ................ 430/312 |
| 2005/0280130 A1 | * | 12/2005 | Nakai ......................... 257/678 |
| 2006/0147684 A1 | * | 7/2006 | Kanda et al. ................ 428/209 |

FOREIGN PATENT DOCUMENTS

JP H02-226152 9/1990

* cited by examiner

*Primary Examiner*—Michael S Lebentritt
(74) *Attorney, Agent, or Firm*—Manabu Kanesaka

(57) ABSTRACT

A method of forming an insulative film includes a step of vacuum laminating an insulative organic material on a substrate that has a peripheral ring electrode formed in a peripheral region of the substrate and a device element(s) formed inside the peripheral region, and has a surface configuration including raised parts. A first dummy pattern is formed in a region between the peripheral ring electrode and the device element on the substrate.

19 Claims, 11 Drawing Sheets

The thickest portion A of the resist locates nearly on the edge 8 of the raised part.

The thickest position B of the resist locates on the peripheral ring electrode 2. The part D is thin.

The thickest position C of the resist locates on the dummy pattern 4. The resist thicknesses at the parts E and F are nearly equal.

METHOD OF FORMING AN INSULATIVE FILM

BACKGROUND OF THE INVENTION AND RELATED ART STATEMENT

The present invention relates to a method of forming an insulative film by vacuum laminating a protective film of an insulative organic material (dry film resist) on a semiconductor substrate or an insulator substrate having device elements formed thereon.

A film of an insulative organic material (dry film resist) is often used for covering and protecting a surface of semiconductor device elements of a semiconductor device having the semiconductor device elements formed on a semiconductor substrate, or a surface of electronic parts of passive elements such as a coil and a capacitor and semiconductor device elements of ICs (integrated circuits) formed on an insulator substrate. There exist raised parts on a surface of a semiconductor substrate caused by semiconductor device elements formed thereon and on a surface of an insulator substrate having an inductor caused by a coil pattern with a thickness of several tens of microns formed thereon. These raised parts have a three dimensional structure. In an ordinary lamination process, air bubbles or voids are trapped in the spacing of this structure.

To avoid the inclusion of the air, a vacuum laminator as a lamination apparatus is known in which a protective film of an insulative organic material (dry film resist) is laminated on the semiconductor substrate or the insulator substrate. The vacuum laminator is provided with a chamber capable of producing a vacuum environment in the chamber by evacuation.

The vacuum laminator is also provided in the chamber with a membrane that can be heated and expands by regulating a pressure. One or more pairs of a substrate and a dry film resist (hereinafter also simply referred to as "a resist"), being able to be accommodated in the chamber, are introduced in the chamber and the chamber is evacuated, where the expanded membrane adhesively presses the resist against the substrate, covering the substrate with the resist.

The patent Document 1 describes an vacuum lamination and discloses a method of obtaining a substantially void free interface between a photosensitive dry film (a resist) and a substrate having a raised relief (Patent Document 1: Japanese Unexamined Patent Application Publication No. H2-226152).

In the above-described conventional technology, however, the resist accumulates (builds up) in the peripheral region of the substrate creating a swell (an elevation mentioned afterwards) of the resist in the peripheral region of the substrate as compared with the flat region in the inner area of the substrate. The device element located at the swelled place becomes off-specification due to the thick resist. Thus, the swelled places cause a problem that the number of defective device elements increase.

The swelled place of the resist in the peripheral region is caused by accumulation (build up) of the resist at the peripheral region of the substrate in the process of vacuum lamination of the resist, in which the heated and softened resist is pressed and extended outwardly by the pressure e.g., atmospheric pressure, towards the edge of the substrate closed by a PET film pressing the resist, as shown in FIG. 2 and described later. The outer edge of the substrate works as a fulcrum of force exerted by a pressure e.g., atmospheric pressure, on the portion of the diaphragm (not shown in FIG. 2) off the substrate 1, the diaphragm pushing the resist 5 against the substrate 1 through the PET film 15. As a result, the diaphragm/PET film is intensely pushed against the outer edge of the substrate, and is deformed by rising upwards at the position right inside the edge, causing build up of the pressed resist at this position. Therefore, the swelled place of the resist is generated at the peripheral region of the substrate. If a peripheral ring electrode is provided at the peripheral region of the substrate, this swelling of the resist grows further.

The following describes a peripheral ring electrode, which affects the swell of the resist in the peripheral area.

In the process of manufacturing a semiconductor device or electronic parts such as an inductor, a plating process is employed in many cases. In a case to form a metal film with a thickness of several tens of µm in particular, the plating process is usually employed. In the case of employing an electroplating process, it is needed to pass an electric current through the substrate (for example, silicon substrate or a ferrite substrate) to be plated. For application of an electric current, a peripheral ring electrode needs to be formed in the peripheral region of the substrate. The peripheral ring electrode is made in contact with an electrode of the plating apparatus in the plating process. A plating process also makes plating on this peripheral ring electrode.

As described previously, the resist accumulates (builds up) and swells in the end region of substrate in which the peripheral ring electrode is arranged. This means a large elevation of resist, that is, a large difference in height between the resist surface and the surface level of the connection terminals (packaged terminals/electrode pads) that are formed at the edge of a device element (an inductor or a semiconductor device element) adjacent to the peripheral ring electrode. This elevation of resist can be too large to meet the requirement of specification, thus increasing the number of defective devices. A large elevation of the resist makes it difficult to carry out soldering between the connection terminals of the device element and the wiring pattern of the printed circuit board.

FIG. 15 is a sectional view of an essential part of a substrate having a resist formed thereon. Although raised parts 3 formed with a pattern of plating have actually a complicated planar and sectional configuration on the surface of the device element 6, a sectional configuration of the raised part 3 formed on one device element is represented by a block for convenience in FIG. 15.

After forming device elements 6 having a pattern of plating of raised parts 3 and a peripheral ring electrode 2 on a substrate 1, a process of vacuum lamination is conducted. The resist 5 swells thick in the region between the peripheral ring electrode 2 and the raised part 3a adjacent to the peripheral ring electrode 2. The raised part 3 is for examples a plating pattern.

The elevation Q of the resist 5 on the raised part 3a is about 30 µm to 40 µm and larger than the elevation R of the resist 5 on the raised part 3b (about 20 µm). An elevation Q exceeding 30 µm results in poor soldering performance between the connection terminal (not shown in the figure) of the device element 6 and the printed circuit board.

A substrate 1 having many device elements 6 involves a problem that the resist is too thin on the raised parts 3 that are arranged with a large distance between raised parts 3 on adjacent device elements 6. A description is made on this problem in the following.

FIGS. 16(a) and 16(b) show a structure of a device element having a resist formed thereon, in which FIG. 16(a) is a sectional view of an essential part and FIG. 16(b) is a plan view of an essential part. FIG. 16(a) is a sectional view along the line 16(a)-16(a) in FIG. 16(b).

After forming a pattern of plating of raised parts 11 (which illustrates details of the raised part 3 in FIG. 15) on one of the many device elements 6 formed on a substrate 1, a resist 5 is formed by vacuum lamination. The raised parts 11 here are obliquely arranged in a rectangular device element 6, assuming a coil conductor of an inductor. While FIG. 15 illustrates only one raised part 3 formed on a device element 6 for convenience, FIGS. 16(a), 16(b) illustrate multiple of slanted raised parts 11 formed on a device element 6, which is more similar to an actual device element.

Comparing with the thickness of resist 5 in the center of the device element 6 (the elevation S, which is the difference between the level of the surface of the raised part and the level of the surface of the resist), the thickness of resist 5 on the raised part 11 in the end region of the device element 6 (elevation P) is thinner (elevation P<elevation S). In the worst case, the plating of the pattern of the raised parts 11 is partly uncovered with the resist.

If the resist 5 is too thin or fails to cover the plating pattern, the resist 5 cannot function as a protective film, degrading reliability of the device element. The raised parts 11 of the plated pattern can be arranged not obliquely but parallel with respect to the edge line of the rectangular device element. In that case, like the case where the plated pattern is arranged obliquely, the resist 5 in the end region of a device element 6 may be too thin or fail to cover the plating, resulting in degraded reliability.

FIG. 17 is a sectional view of an essential part along the line 17-17 in FIG. 16(b). The distance W1 between the opposing raised parts 11 of adjacent device elements 6 is equal in both cases of the section along the line 16(a)-16(a) and the section along the line 17-17. Therefore, the sectional configuration of the resist 5 on the raised parts 11 in FIG. 17 is the same as in FIG. 16(a).

It is an object of the present invention to solve the above problems and provide a method of forming an insulative film, wherein accumulation (build up) of resist at a peripheral ring electrode is suppressed to reduce elevation (swell) of resist on a raised part of a device element adjacent to the peripheral ring electrode, and decrease of a thickness of resist on a raised part is decreased at an end region of a device element.

Further objects and advantages of the invention will be apparent from the following description of the invention.

SUMMARY OF THE INVENTION

To achieve the above object, a method of forming an insulative film according to the invention includes a step of vacuum laminating an insulative organic material on a substrate that has a peripheral ring electrode formed in a peripheral region of the substrate and a device element(s) formed inside of the peripheral region and has a surface configuration including raised parts, wherein a first dummy pattern is formed in a region between the peripheral ring electrode and the device element on the substrate.

Preferably, the insulative organic material is, a dry film resist.

Preferably, the first dummy pattern is a plating pattern formed on the substrate, a through-hole pattern formed in the substrate, or a depression pattern formed by pits dug from a surface of the substrate.

Furthermore, the first dummy pattern is preferably a pattern of a rectangle(s) or a pattern of an ellipse(s), each pattern having a longitudinal direction at right angle or in parallel to an edge line of the peripheral ring electrode, or each pattern having a combination of longitudinal directions at right angle and in parallel to the edge line of the peripheral ring electrode.

The first dummy pattern can be a pattern of a square(s) or a pattern of a circle(s).

The first dummy pattern can be also a pattern comprising squares or circles that are arranged in a lattice.

Preferably, a distance between the first dummy pattern and the device element is substantially equal to (or has substantially the same pitch as) a distance between the device elements formed on the substrate.

The first dummy patterns described above can be combined together.

Preferably, the first dummy pattern has the same configuration as a part or the whole of a pattern of the device element, and the first dummy pattern has the same repetition period as a repetition period of the device elements formed on the substrate.

A method of forming an insulative film according to the invention includes a step of vacuum laminating an insulative organic material on a substrate that has a device element(s) formed on the substrate and has a surface configuration including raised parts, wherein a second dummy pattern is formed in a side region of the device element(s).

A method of forming an insulative film according to the invention includes a step of vacuum laminating an insulative organic material on a substrate that has a peripheral ring electrode formed in a peripheral region of the substrate and a device element(s) formed inside of the peripheral region, and has a surface configuration including raised parts, wherein a second dummy pattern is formed in a side region of the device element(s).

A method of forming an insulative film according to the invention includes a step of vacuum laminating an insulative organic material on a substrate that has a peripheral ring electrode formed in a peripheral region of the substrate and a device element(s) formed inside of the peripheral region, and has a surface configuration including raised parts, wherein a first dummy pattern is formed in a region between the peripheral ring electrode and the device element on the substrate, and a second dummy pattern is formed in a side region of the device element(s).

Preferably, the insulative organic material is a dry film resist.

In a method of forming an insulative film according to the invention, a first dummy pattern can be formed, in addition to the second dummy pattern, in a region between the peripheral ring electrode and the device element on the substrate.

Preferably, the second dummy pattern is a plating pattern formed on the substrate.

Preferably, the plating pattern is a rectangular pattern arranged parallel to the side of the device element(s) The plating pattern can have a triangular shape or a trapezoidal shape.

The plating pattern can be composed of a plurality of components each having approximately rectangular shape.

In the method of the invention, a dummy pattern (the first dummy pattern) is provided between the peripheral ring electrode and a device element, and as a result, the place at which accumulation of resist occurs is located above the dummy pattern, thereby reducing the elevation of the insulator film (resist) on the device element adjacent to the peripheral ring electrode. Therefore, the number of defective device elements adjacent to the peripheral ring electrode is reduced and the rate of good device elements is improved. This first dummy pattern is formed of a plating pattern (raised pattern) or a through-hole(s).

In another embodiment according to the invention, a dummy pattern (second dummy pattern) is provided in a side region of a device element, thereby restricting decrease of a thickness of the insulator film (resist) in the side region of the device element, and preventing the insulator film from becoming thin. Therefore, the rate of manufacturing good device elements is improved. This second dummy pattern is formed of a plating pattern (raised pattern).

The effect described above can be enhanced by a dummy pattern having the same configuration as that of the plating pattern formed of raised parts of the device element.

Further, the dummy pattern formed between the peripheral ring electrode and the device element prevents a raised part of the device element adjacent to the peripheral ring electrode from becoming thin.

BRIEF DESCRIPTION OF THE DRAWINGS

FIGS. 3(a), 3(b) and 3(c) show the positions at which a thickness of a resist film is the maximum, in which FIG. 3(a) shows the case of a narrow distance between a peripheral ring electrode and a raised part adjacent to the electrode, FIG. 3(b) shows the case of a wide distance between a peripheral ring electrode and a raised part adjacent to the electrode, and FIG. 3(c) shows the case provided with a dummy pattern between a peripheral ring electrode and a raised part adjacent to the electrode.

FIGS. 4(a) and 4(b) show an arrangement of the dummy pattern in the first embodiment of a method of forming an insulator film according to the invention, in which FIG. 4(a) is a sectional view of an essential part of a substrate having an insulator film formed thereon, and FIG. 4(b) is a plan view of an essential part of the substrate having raised parts formed thereon.

FIGS. 9(a) and 9(b) show an arrangement of the dummy pattern in the second embodiment of a method of forming an insulator film according to the invention, in which FIG. 9(a) is a sectional view of an essential part of a substrate having an insulator film formed thereon, and FIG. 9(b) is a plan view of an essential part of the substrate.

FIGS. 10(a) and 10(b) show an arrangement of the dummy pattern in the third embodiment of a method of forming an insulator film according to the invention, in which FIG. 10(a) is a sectional view of an essential part of a device element having an insulator film formed thereon, and FIG. 10(b) is a plan view of an essential part of the device element.

FIGS. 16(a) and 16(b) show a structure of a conventional device element having a resist formed thereon, in which FIG. 16(a) is a sectional view of an essential part, and FIG. 16(b) is a plan view of an essential part.

DETAILED DESCRIPTION OF PREFERRED EMBODIMENTS

Now, some preferred embodiments according to the invention will be described with reference to accompanying drawings.

In the following description, the parts similar to those in the conventional structure are given the same symbols as in the conventional structure.

Figure 1:
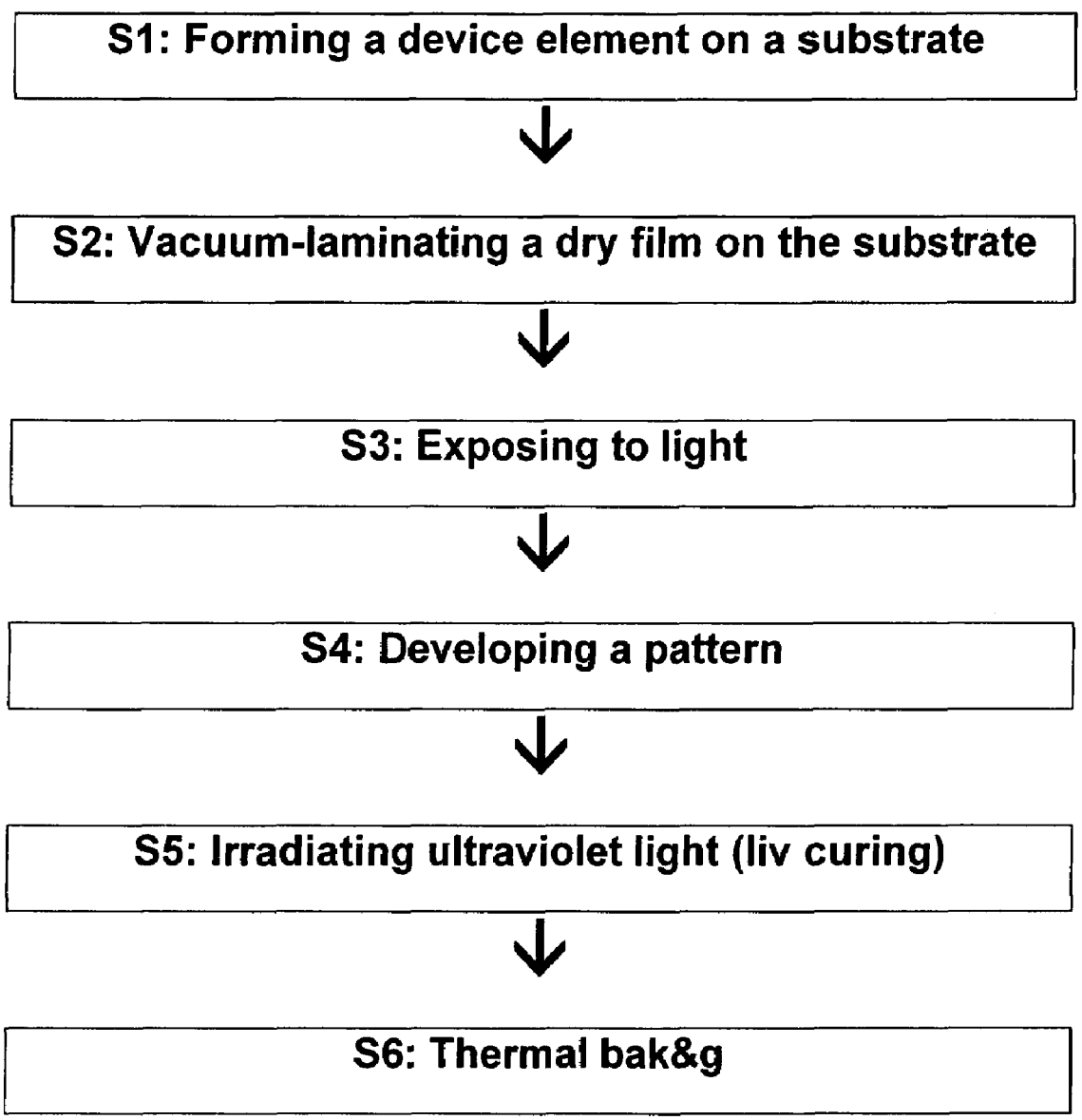
FIG. 1 is a flow chart showing a part of the processes in an embodiment of a method of forming an insulator film according to the invention.

FIG. 1 is a flow chart showing a part of the processes in an embodiment of a method of forming an insulator film according to the invention. An insulator film in this example is a dry film resist (hereinafter referred to as "a resist").

Referring to the flow chart of FIG. 1, a device element(s) is first formed on a substrate (S1). This device element is a semiconductor device element or an inductor, for example. The semiconductor device element, when applicable, has a wiring and connection terminals formed on the surface of a silicon substrate. In the case of an inductor, a coil conductor(s) and connection terminals are formed on a ferrite substrate. Those wiring, coil conductor and connection terminals are formed of plating, for example, and protruding as raised parts from the substrate surface, that is, raised parts are present on the surface of the device element. Thus, irregularity exists on the surface of a substrate having wiring, coil conductors, and connection terminals, and the substrate has many raised parts on its surface.

Then, the substrate surface having raised parts is vacuum-laminated with a resist (S2). Then, the resist is exposed to light using a photo-mask (S3), and subsequently, the pattern is developed to open connection terminals (S4).

After that, ultraviolet light irradiation (UV curing) is conducted (S5), followed by the thermal baking (S6), to complete a series of processes for forming a protective film of resist.

Figure 2:
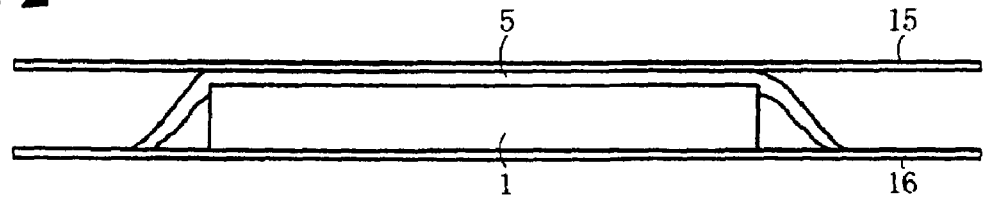
FIG. 2 is a sectional view of an essential part showing an arrangement of a substrate, a resist, and a PET film in a process of vacuum lamination.

FIG. 2 is a sectional view of an essential part showing an arrangement of a substrate, a resist, and a PET (polyethylene terephthalate) film in a process of vacuum lamination.

The substrate 1 having wiring and other parts is disposed on a lower PET film 16. On the substrate 1, the resist 5 is disposed, and an upper PET film 15 is disposed on the resist 5.

The lower PET film can be used as a transporter PET film, or another PET film can be added on a transporter film.

The upper and lower PET films are usually applied for avoiding adhesion and contamination, due to ooze out of the resist 5 in the process of lamination, to diaphragms (not shown in the figure) for pressing through the PET films 15, 16.

In the present invention, a dummy pattern is provided on the substrate (and device elements) to make the thickness of the insulator film (resist 5) flat (to decrease elevation on the insulator film) in this manufacturing process.

Figure 3A:
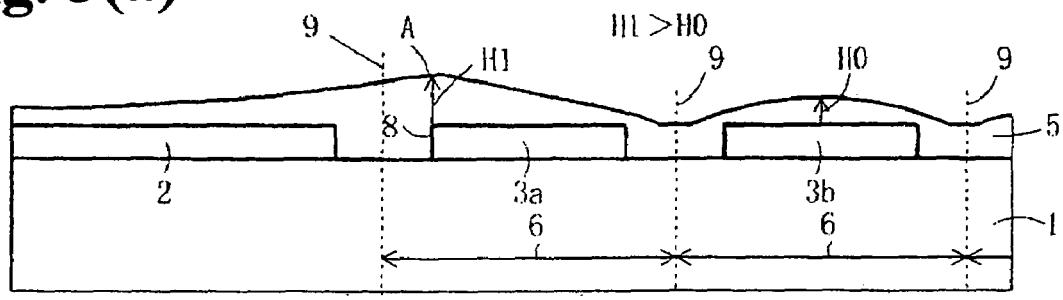
Figure 3B:
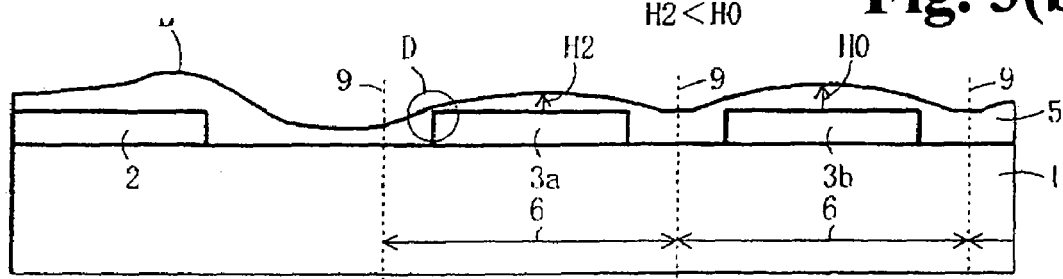
Figure 3C:
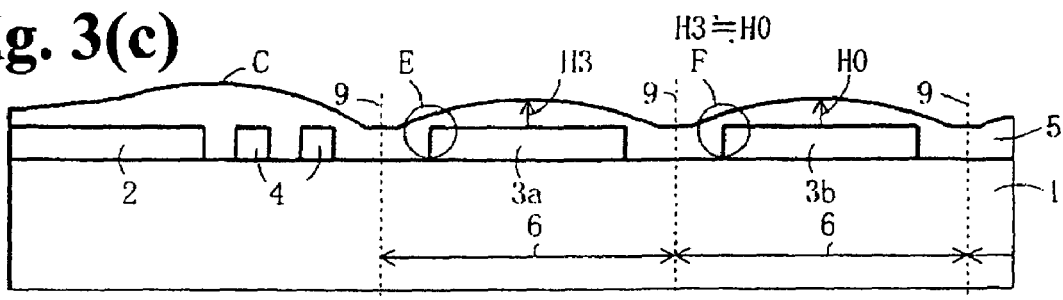

FIGS. 3(a), 3(b) and 3(c) show the positions at which a thickness of a resist film is the maximum, in which FIG. 3(a) shows the case of a narrow distance between a peripheral ring electrode and a raised part adjacent to the electrode, FIG. 3(b) shows the case of a wide distance between a peripheral ring electrode and a raised part adjacent to the electrode, and FIG. 3(c) shows the case provided with a dummy pattern between a peripheral ring electrode and a raised part adjacent to the electrode.

In FIG. 3(a), the position A of the maximum thickness of resist 5 is formed around the end 8 of the raised part 3a. The maximum value H1 of the thickness of resist 5 over the raised part 3a is larger than the maximum value H0 of the thickness of resist 5 over the inner raised part 3b.

In FIG. 3(b), the position B of the maximum thickness of resist 5 is formed above the peripheral ring electrode 2. The thickness of resist 5 at the edge D of the raised part 3a is thin, and the maximum value H2 of the thickness of resist 5 over the raised part 3a is smaller than the maximum value H0 of the thickness of resist 5 over the raised part 3b.

In FIG. 3(c), which shows an embodiment of the invention, the position C of the maximum thickness of resist 5 is formed between the peripheral ring electrode 2 and the dummy pattern 4. The thickness of the resist 5 at the end E of the raised part 3a is approximately equal to the thickness of resist 5 at the end F of the raised part 3b. The maximum value H3 of the thickness of the resist 5 over the raised part 3a is approximately equal to the maximum value H0 of the thickness of the resist 5 over the raised part 3b. In the FIGS. 3(a), 3(b) and 3(c), the symbol 1 is a substrate, the symbols 3a, 3b are a raised part, the symbol 6 is a device element, and the symbol 9 is a scribe line.

More detailed description will be made on the dummy pattern 4 formed on the substrate 1 and the device element 6 with reference to specific examples.

EXAMPLE 1

Figure 4A:
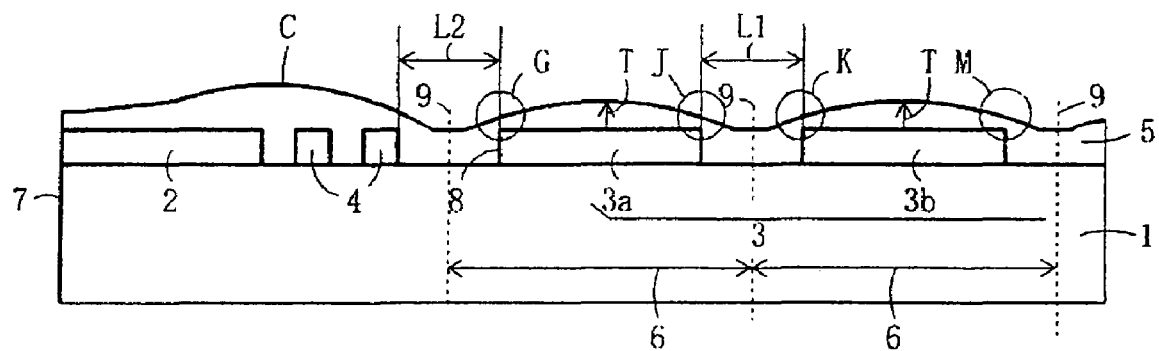
Figure 4B:
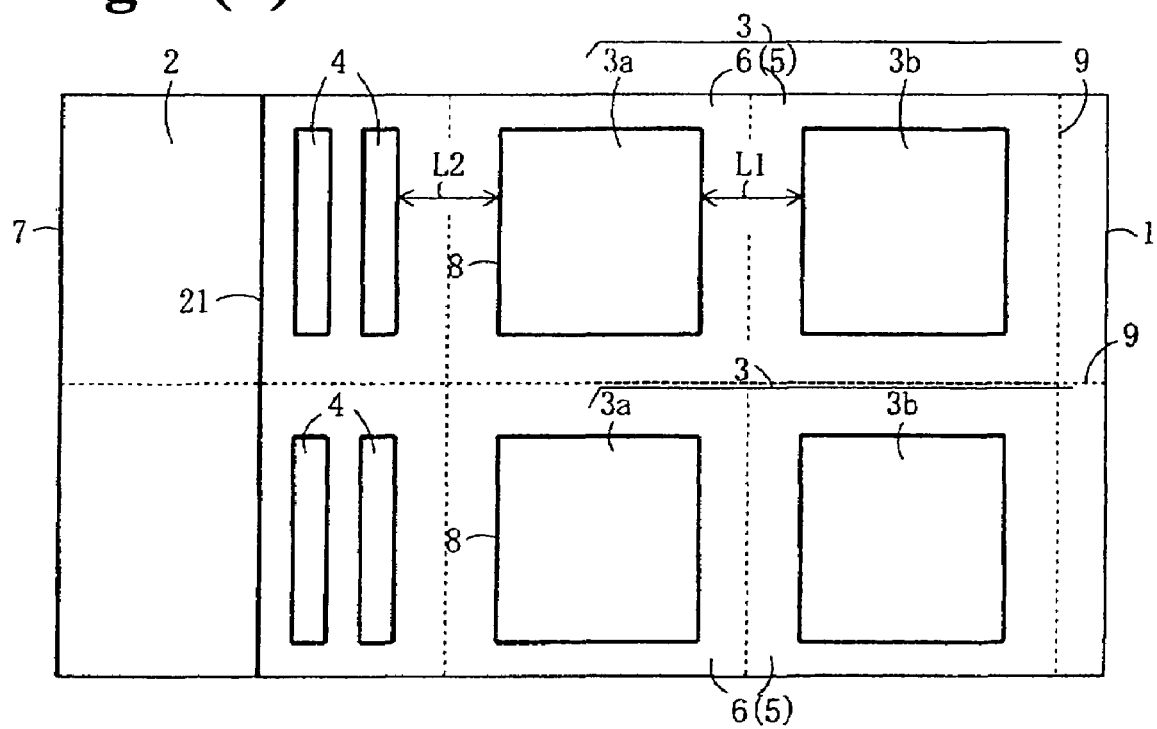

FIGS. 4(a) and 4(b) show an arrangement of a dummy pattern in the first embodiment of a method of forming an insulator film according to the invention, in which FIG. 4(a) is a sectional view of an essential part of a substrate having an insulator film formed thereon, and FIG. 4(b) is a plan view of the substrate. An example of an insulator film here is a resist 5. In the description of Example 1, the dummy pattern 4 is formed of a plating. This dummy pattern 4 is a type of the first dummy pattern mentioned in the claims.

As described previously referring to the manufacturing process of FIG. 1, after forming device elements 6 having a plating pattern of raised parts 3, a peripheral ring electrode 2, and a dummy pattern 4 of plating between the peripheral ring electrode 2 and the device element 6 on a substrate 1, a process of vacuum lamination is conducted. In FIGS. 4(a) and 4(b), the planar pattern of a raised part 3 of a plating pattern formed on one device element 6 is represented by a square for convenience. Actually, the planar pattern includes patterns of wiring, coil conductors and electrodes, which complicate planar and sectional configurations.

The peripheral ring electrode 2 and the dummy pattern 4 are formed by plating simultaneously with the raised part 3 formed on the device element.

The distance L2 between the dummy pattern 4 and the raised part 3a is made nearly equal to the distance L1 between the raised part 3a and the raised part 3b.

The width of the peripheral ring electrode 2 is made narrower than a conventional one to provide with the dummy pattern 4. As a result of this arrangement, a peak of swell of the resist 5 (the position C of the maximum thickness of the resist film) is generated between the peripheral ring electrode 2 and the dummy pattern 4. The elevation T of the resist 5 over the raised part 3a of the device element 6 next to the dummy pattern 4 is approximately equal to the elevation T of the resist 5 over the raised part 3b. Further, the thicknesses of the resist film on the ends of the raised part 3a (at the positions G and J) are approximately equal to the thicknesses of the resist film at the ends of the raised part 3b (at the positions K and M). Description is made on the arrangement of the dummy pattern 4 as follows.

In FIG. 4(b), the dummy pattern is formed of rectangles that are arranged with their longitudinal directions in parallel with the edge line 21 of the peripheral ring electrode 2. Two rectangles are arranged corresponding to the device element 6.

Figure 5:
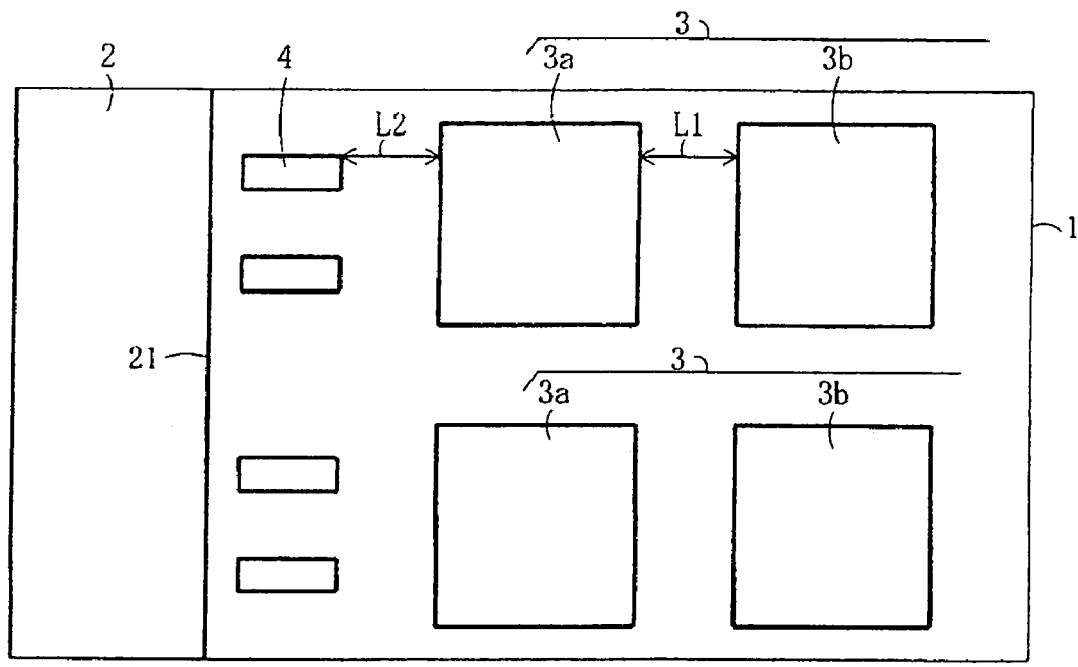
FIG. 5 shows another arrangement of a dummy pattern.

The dummy pattern 4 can be arranged with its longitudinal direction perpendicularly to the edge line 21 of the peripheral ring electrode 2 as shown in FIG. 5. The number of components of the pattern is not limited to two.

The rectangle of the pattern can be replaced by ellipses though not shown in the figure.

Figure 6:
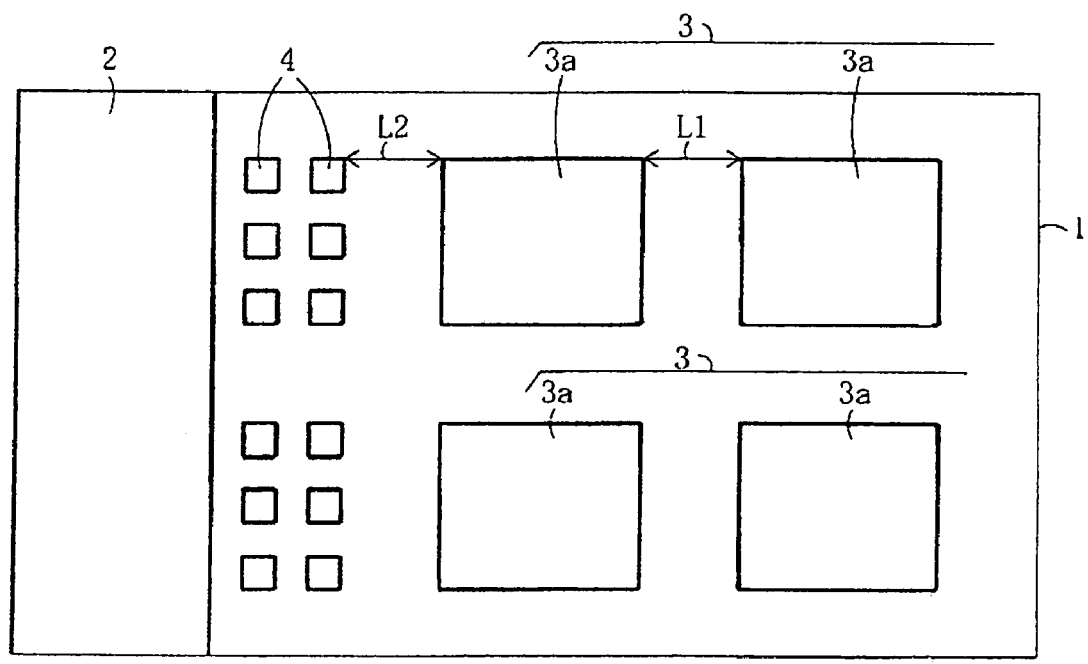
FIG. 6 shows another arrangement of a dummy pattern.

The dummy pattern 4 can be composed of squares that can be arranged in a lattice as shown in FIG. 6. In addition to squares, circles can form the pattern though not shown in the figure. The dummy pattern can be formed of components with any other configuration.

The pattern can be formed in any combination of shapes described above.

Figure 7:
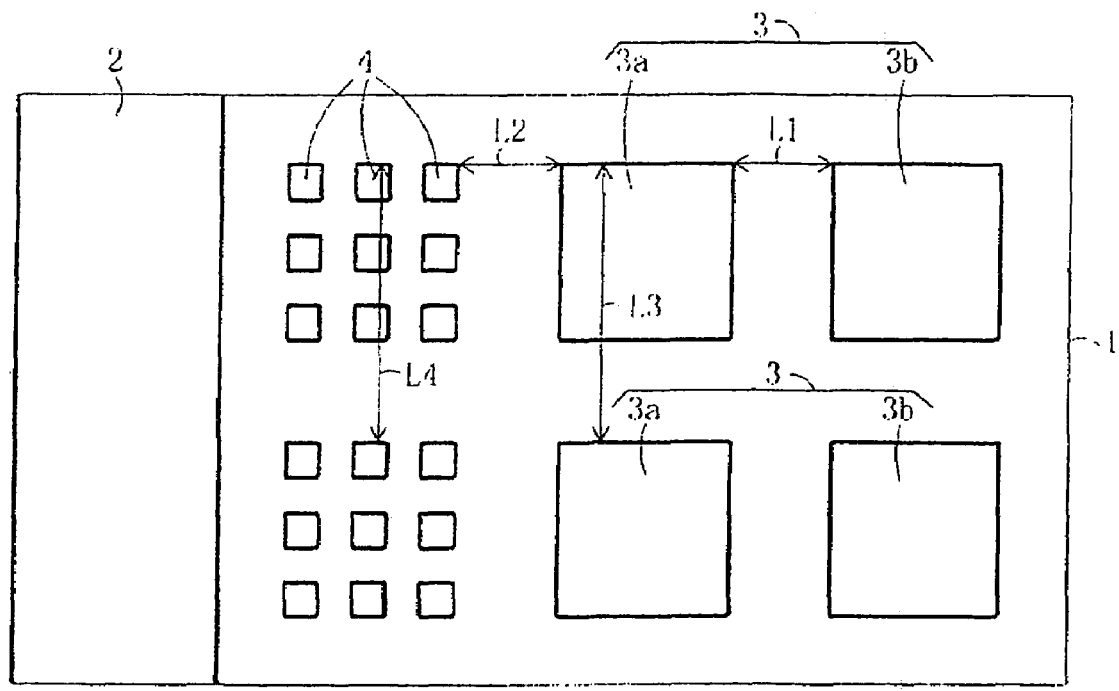
FIG. 7 shows another arrangement of a dummy pattern.

The dummy pattern can be formed by repeating a basic pattern in the same period as the device elements 6 as shown in FIG. 7, that is, the pitch L4 of the dummy pattern is equal to the pitch L3 of the device elements. This means that the dummy pattern 4 has the same repetition period as the device elements 6.

Figure 8:
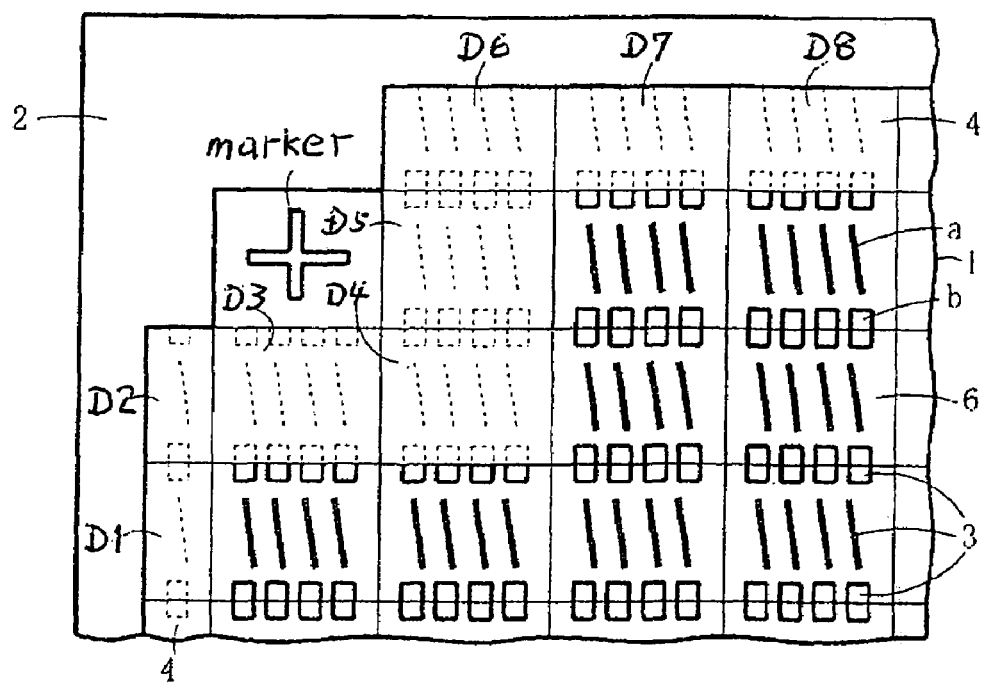
FIG. 8 shows dummy patterns formed of the same pattern as the pattern composing the device elements.

Further, as shown in FIG. 8, the dummy pattern 4 can have the same configuration as a part or a whole of the raised parts of the device element 6 and repeated in the same period as the device elements. As a result, the patterns under the resist 5 are similar in both the region of the dummy pattern 4 and the region of raised part of the device element 6. With this arrangement, the dummy pattern 4 reduces the influence of discontinuity of conditions in resist lamination in the peripheral region of the substrate, and makes the conditions in the resist lamination approximately uniform for every device elements 6 inside the dummy pattern 4. Thus, the elevation of the resist 5 on the raised part of every device element other than the dummy pattern 4 is uniform over the entire substrate 1, preventing the elevation from growing on the device element 6 in the peripheral region.

FIG. 8 shows the case of the device element 6 of an inductor, in which "a" designates a coil conductor and "b" designates a connection terminal. Of the dummy patterns in FIG. 8, the patterns D1 and D2 are the same as a part of the pattern of the device element 6; the patterns D3, D4 and D5 are the same as the whole of the pattern of the device element 6; and the pattern D6, D7 and D8 are the same as a part of the pattern of the device element 6. The dummy patterns are repeated in the same period as the device elements 6.

Figure 15:
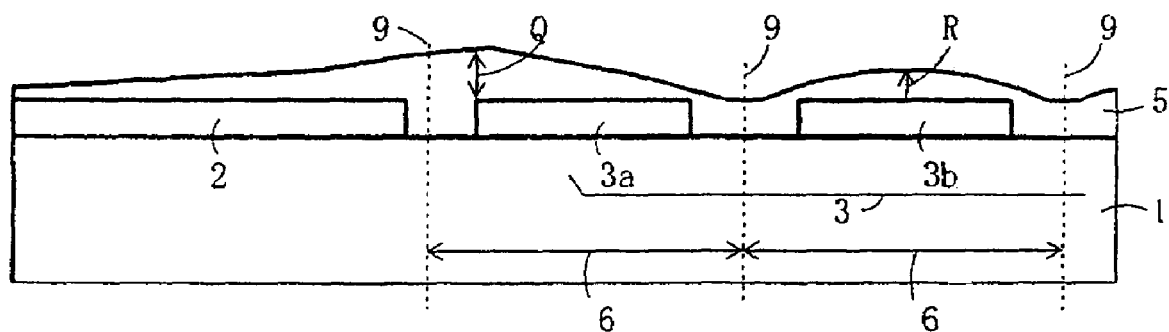
FIG. 15 is a sectional view of an essential part of a substrate having a resist formed thereon.

Provision of the dummy pattern has a favorable additional effect. In a conventional structure without a dummy pattern (refer to FIG. 15), a plating pattern of a raised part 3a adjacent to the peripheral ring electrode 2 tends to be formed thinner than a plating pattern of an inner raised pattern 3b. By arranging a dummy pattern 4 in the region between the peripheral ring electrode 2 and raised part 3a, which otherwise might be of a thin plating pattern, as shown in FIG. 4, it becomes possible to obtain a plating pattern of raised part 3a having the same thickness as that of a plating pattern of raised part 3b, achieving a uniform thickness of raised parts in all device elements.

While Example 1 is described in the case of a dummy pattern 4 formed by plating, the dummy pattern is not necessarily formed by plating, but can be formed by evaporation or sputtering. Further, the dummy pattern 4 can be formed of a resin.

EXAMPLE 2

Figure 9A:
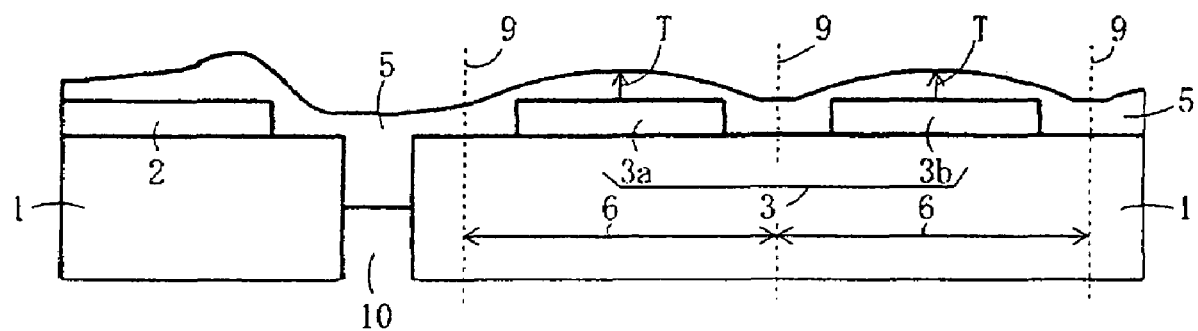
Figure 9B:
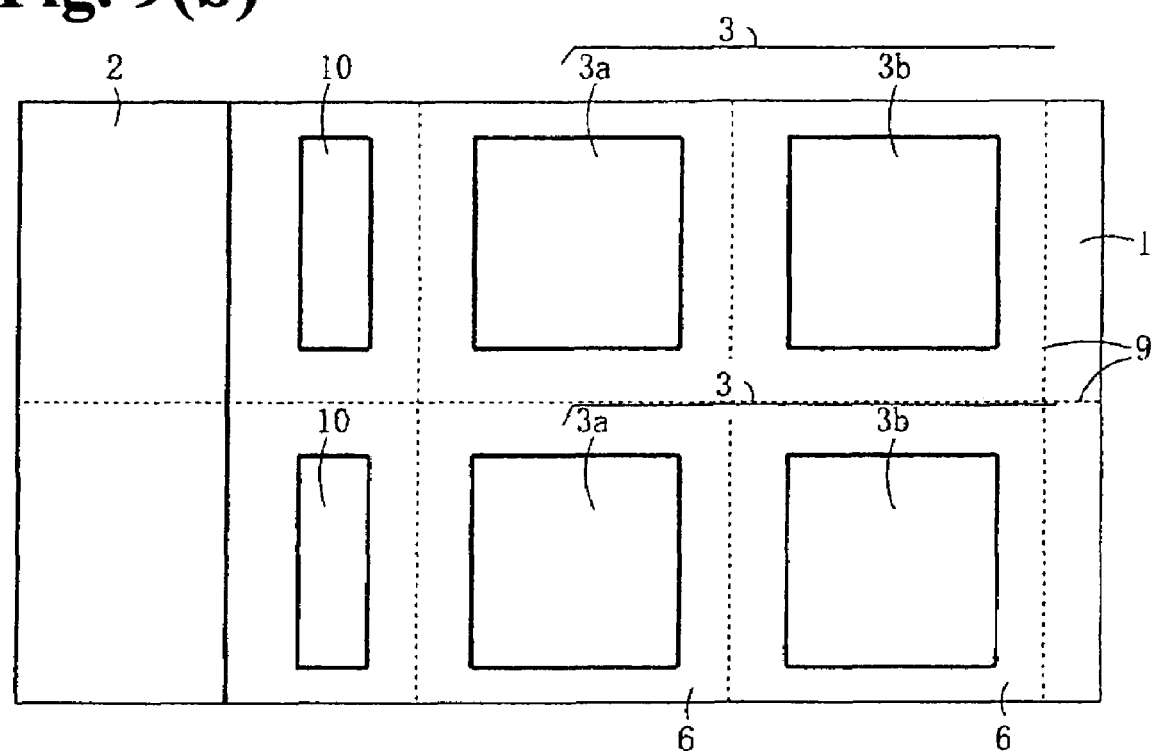

FIGS. 9(*a*) and 9(*b*) show an arrangement of the dummy pattern in the second embodiment of a method of forming an insulator film according to the invention, in which FIG. 9(*a*) is a sectional view of an essential part of a substrate having an insulator film formed thereon, and FIG. 9(*b*) is a plan view of an essential part of the substrate. The insulator film in this example is a resist 5. The dummy pattern 10 is the same as the first dummy pattern mentioned in the claims.

The dummy pattern 10 in this Example 2 is formed of a through-hole(s) in place of the plating in Example 1. The peripheral ring electrode 2 is made narrower to provide a dummy pattern 10 of a through-hole(s) between the peripheral ring electrode 2 and the device element 6. In this arrangement, in which the resist 5 flows into the through-hole of the dummy pattern 10, the swell of resist 5 over the raised part 3*a* is reduced, making the elevation T of resist 5 over the raised part 3*a* of the device element 6 adjacent to the through-hole of the dummy pattern 10 to be approximately equal to the elevation T of resist 5 over the raised part 3*b*.

While in FIGS. 9(*a*) and 9(*b*), one through-hole of dummy pattern 10 is arranged parallel to the edge line of the peripheral ring electrode 2 opposing a device element 6, the through-hole can be arranged perpendicular to the edge line of the peripheral ring electrode 2. The number of the through-holes can be two or more.

The dummy pattern can be composed of through-holes having a square shape and arranged in a lattice, though not shown in the figure. The shape of the through-hole can be a circle in stead of a square.

The dummy pattern 10 can be a repeated pattern with the same period as the device element 6, though not shown in the figure.

Since the resist 5 is drawn into the through-hole in Example 2, the distance between the peripheral ring electrode 2 and the device element 6 can be shortened as compared with the distance in Example 1. The same effect can be achieved by replacing the through-holes by pits.

EXAMPLE 3

Figure 10A:
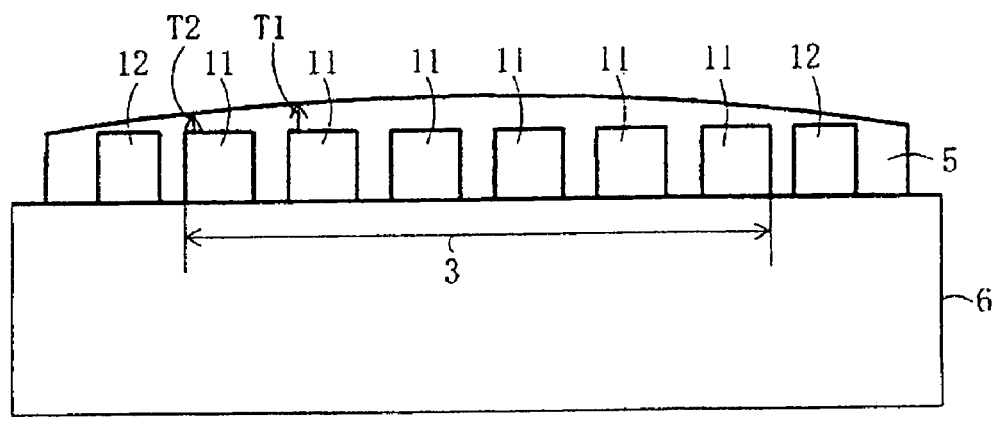
Figure 10B:
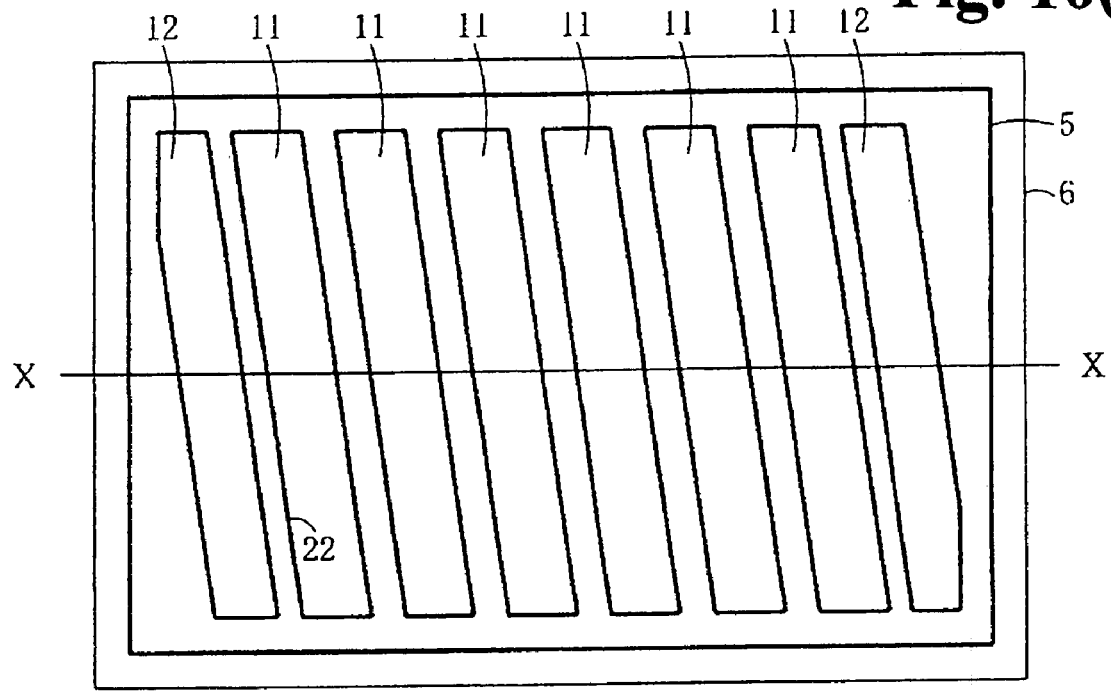

FIGS. 10(*a*) and 10(*b*) show an arrangement of the dummy pattern in the third embodiment of a method of forming an insulator film according to the invention, in which FIG. 10(*a*) is a sectional view of an essential part of a device element having an insulator film formed thereon, and FIG. 10(*b*) is a plan view of an essential part of the device element. The insulator film in this Example 3 is a resist 5. A peripheral ring electrode (not shown in the figure) is formed in the peripheral region of the substrate. A dummy pattern (not shown in FIGS. 10(*a*) and 10(*b*), but similar to the dummy pattern 4 in FIG. 4) is formed between the peripheral ring electrode and the device element 6. The dummy pattern 12 is the same as the second dummy pattern.

Six raised parts 11 such as coil conductors with a parallelogram shape are formed on the device element 6. Dummy patterns 12 are formed in the side regions free of the raised parts 11 of the device element 6. The six raised parts 11, combined together, correspond to one raised part 3*a* or 3*b* in FIGS. 4(*a*) and 4(*b*). As shown in the sectional view of FIG. 10(*a*), the dummy pattern 12 is a protrusion and formed of a plating like the raised parts 11 of the device element 6. The dummy pattern 12 is arranged parallel to the edge line 22 of the raised part 11 and has a shape of approximately parallelogram.

Figure 16A:
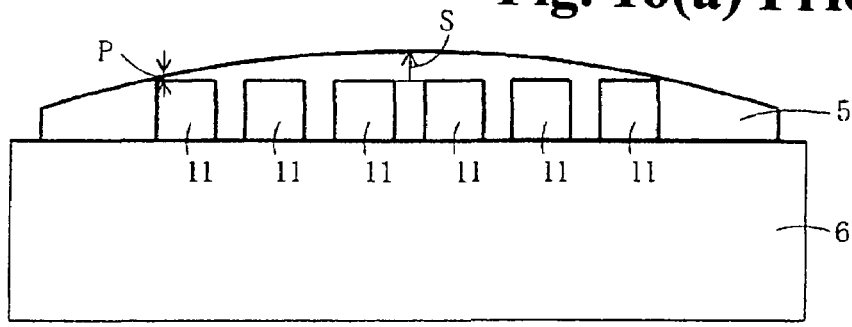
Figure 16B:
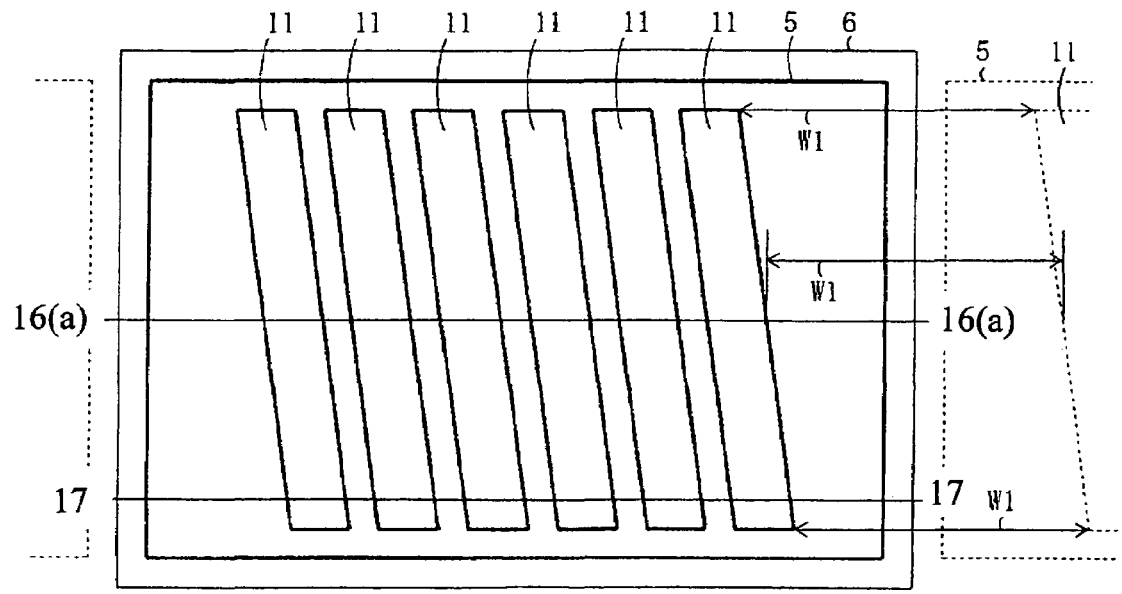
Figure 17:
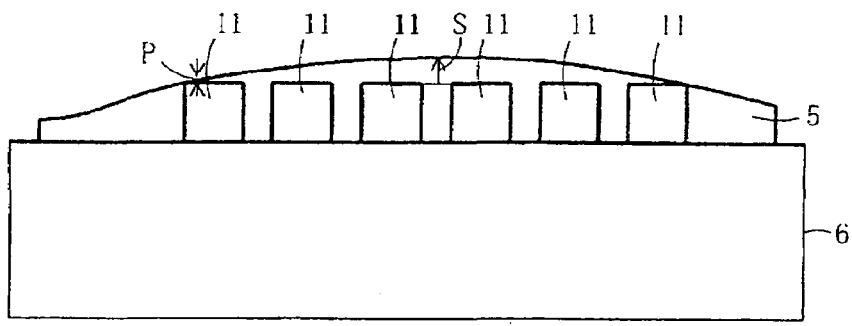
FIG. 17 is a sectional view of an essential part taken along a line 17-17 in FIG. 16(b).

By arranging the dummy pattern 12 at the end region of the device element 6, the resist 5 grows thicker because of the added volume of dummy pattern 12, thereby moderating the decrease of thickness of resist 5 on the plating pattern of raised part 11 that is located at the end region of the device element 6. The resist thickness T2 in FIG. 10(*a*) can be made thicker than the resist thickness P in FIG. 16. The resist thickness T1 (in FIG. 10(*a*)) is thicker than T2.

Figure 11:
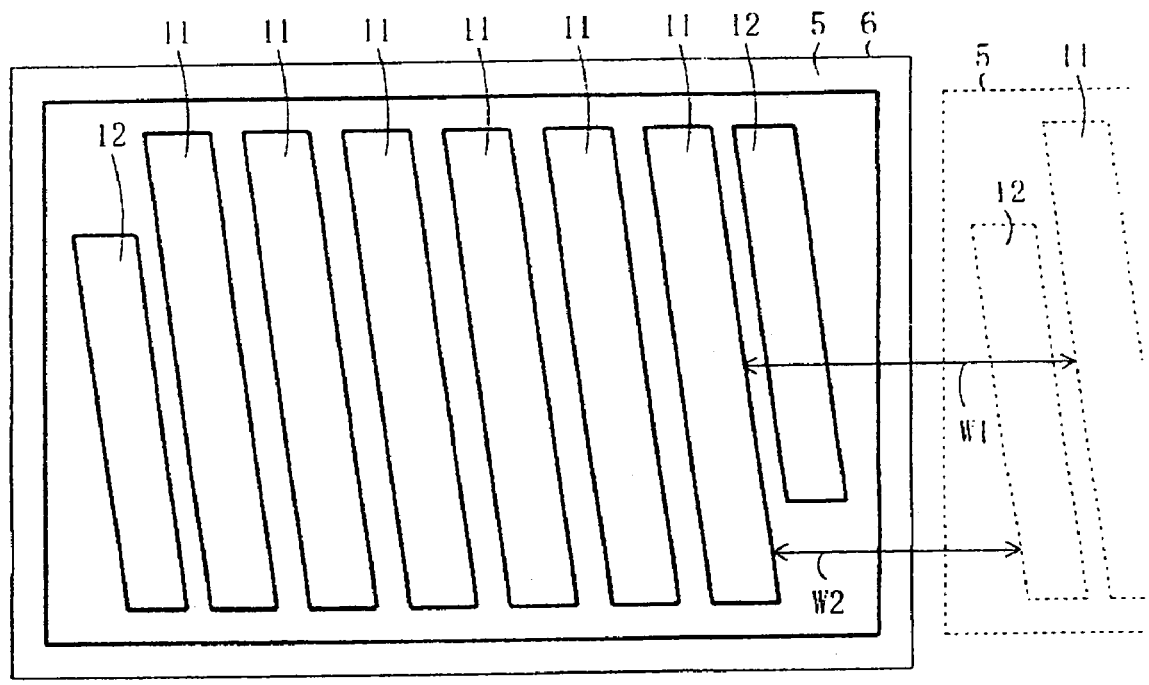
FIG. 11 is another plan view of a device element.

FIG. 11 shows a dummy pattern 12 shorter than the plating pattern of the raised part 11 of the device element 6. The short dummy pattern 12 creates an area lacking a dummy pattern. Nevertheless, these short dummy patterns 12 can also suppress the decrease of thickness of resist 5, because the distance W2 between the raised part 11 on a device element 6 and a dummy pattern 12 on the adjacent device element 6 is narrower than the distance W1 between a raised part 11 on a device element 6 and a raised part 11 on an adjacent device element 6. However, when the space is enough, it is preferable to provide a dummy pattern 12 with the same length as a raised part 11 at the end region of the device element 6.

Figure 12:
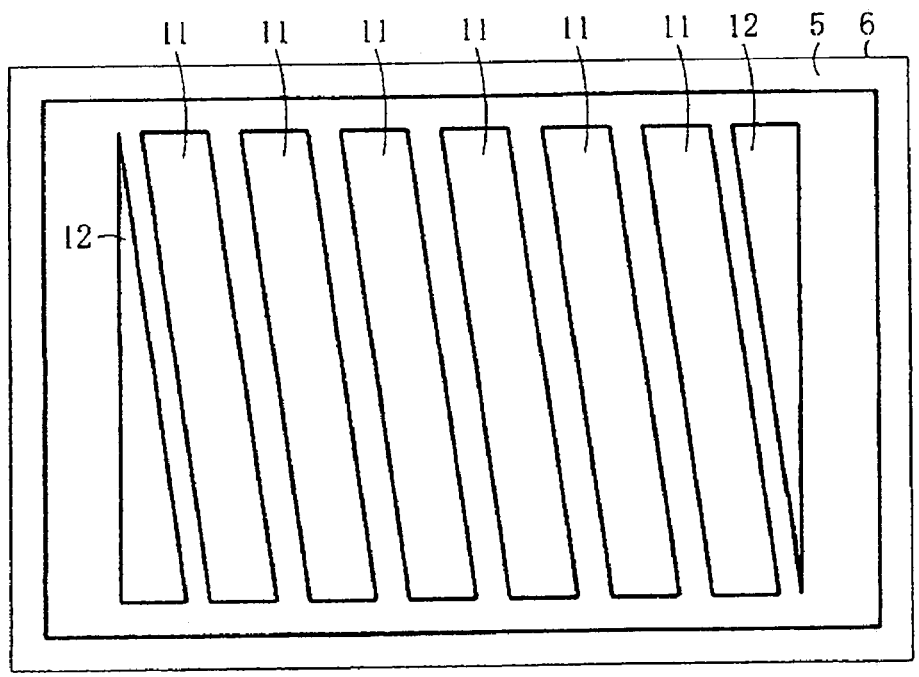
FIG. 12 is another plan view of a device element.

FIG. 12 shows a dummy pattern 12 having a triangular shape, which also has the same effect as in the above example.

Figure 13:
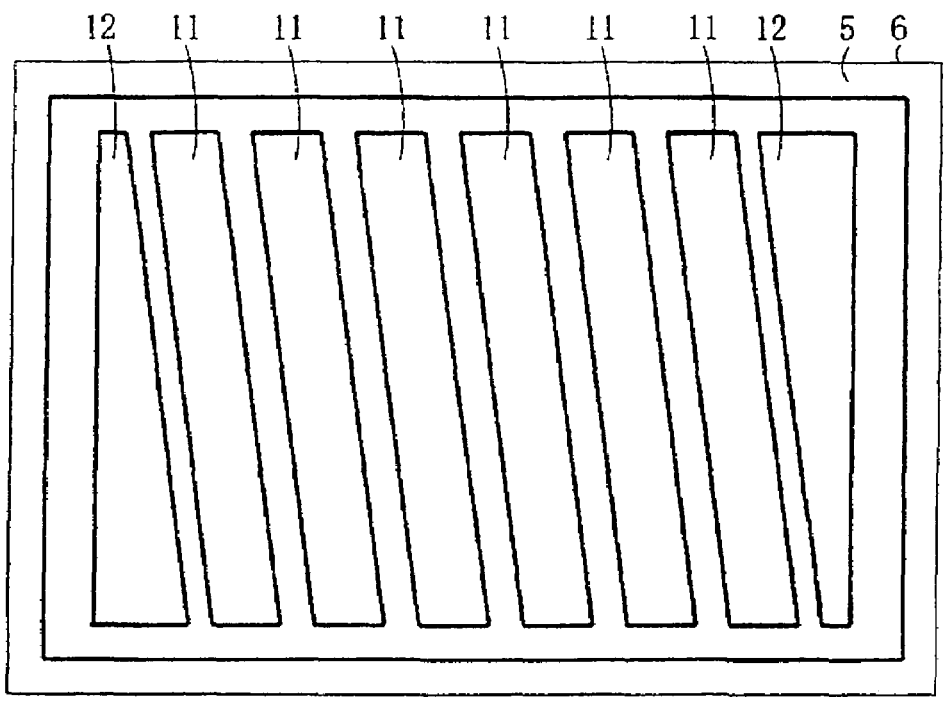
FIG. 13 is another plan view of a device element.

FIG. 13 shows a dummy pattern 12 having a trapezoidal shape, which also has the same effect.

Figure 14:
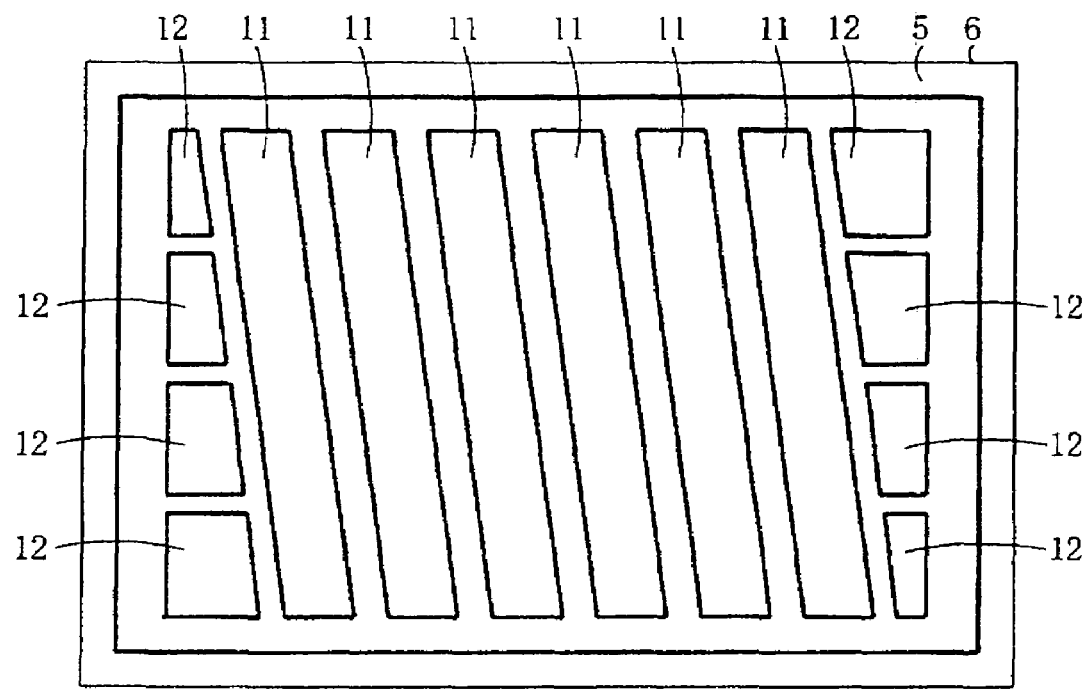
FIG. 14 is another plan view of a device element.

FIG. 14 shows a dummy pattern 12 composed of several small trapezoids. This dummy pattern has also the same effect. Of course, a dummy pattern 12 can be composed of a multiple of rectangular shapes. If a broad area of dummy pattern causes a locally thin portion of plating of a raised part 11, which usually creates a problem, a better result is obtained by a dummy pattern formed of a plurality of small pieces of plating.

The dummy pattern 12 can be composed of a plurality of approximately quadrilateral shapes.

The disclosure as disclosed in Japanese Patent Application No. 2006-223775, filed on Aug. 21, 2006, is incorporated herein by reference.

While the invention has been explained with reference to the specific embodiments of the invention, the explanation is illustrative, and the invention is only by appended claims.

What is claimed is:

1. A method of forming an insulative film comprising:
   preparing a substrate having a device element thereon to thereby form a raised part on the substrate,
   preparing a first dummy pattern on the substrate adjacent to the device element, and
   vacuum-laminating an insulative organic material on the substrate to cover the device element and the dummy pattern.

2. The method of forming an insulative film according to claim 1, wherein said substrate further includes a peripheral ring electrode in a peripheral region of the substrate, said device element being formed inside of the peripheral region.

3. The method of forming an insulative film according to claim 2, wherein said first dummy pattern is formed in a region between the peripheral ring electrode and the device element on the substrate.

4. The method of forming an insulative film according to claim 3, wherein said insulative organic material is a dry film resist.

5. The method of forming an insulative film according to claim 3, wherein said first dummy pattern is a plating pattern formed on the substrate, a through-hole pattern formed on the substrate, or a depression pattern formed by pits dug from a surface of the substrate.

6. The method of forming an insulative film according to claim 5, wherein said first dummy pattern is a pattern of a rectangle or a pattern of an ellipse, each of said pattern having a longitudinal direction at right angle, or parallel to an edge line of the peripheral ring electrode, or combination thereof.

7. The method of forming an insulative film according to claim 5, wherein said first dummy pattern is a pattern of a square or a pattern of a circle.

8. The method of forming an insulative film according to claim 7, wherein said first dummy pattern is a pattern comprising a plurality of squares or circles arranged in a lattice.

9. The method of forming an insulative film according to claim 6, wherein said first dummy pattern and the device element are formed to have a distance substantially equal to a distance between device elements formed on the substrate.

10. The method of forming an insulative film according to claim 4, wherein said first dummy pattern comprises a combination of patterns selected from a plating pattern formed on the substrate, a through-hole pattern formed on the substrate, and a depression pattern formed by pits dug from a surface of the substrate.

11. The method of forming an insulative film according to claim 3, wherein said first dummy pattern is formed to have a same configuration as a part or a whole of a pattern of the device element, the first dummy pattern having a same repetition period as a repetition period of device elements formed on the substrate.

12. The method of forming an insulative film according to claim 1, wherein said first dummy pattern is formed in a side region of the device element.

13. The method of forming an insulative film according to claim 2, wherein said first dummy pattern is formed in a side region of the device element.

14. A method of forming an insulative film according to claim 3, further comprising forming a second dummy pattern in a side region of the device element.

15. The method of forming an insulative film according to claim 12, wherein said insulative organic material is a dry film resist.

16. The method of forming an insulative film according to claim 12, wherein said first dummy pattern is a plating pattern formed on the substrate.

17. The method of forming an insulative film according to claim 16, wherein said plating pattern is a rectangular pattern arranged parallel to the side region of the device element.

18. The method of forming an insulative film according to claim 16, wherein said plating pattern has a triangular shape or a trapezoidal shape.

19. The method of forming an insulative film according to claim 16, wherein said plating pattern is composed of a, plurality of components, said components having approximately rectangular shape.

* * * * *